United States Patent [19]

Rijckaert

[11] 4,258,282

[45] Mar. 24, 1981

[54] DEVICE FOR THE GENERATION OF A CONTROL VOLTAGE ACROSS A PIEZO-ELECTRIC POSITIONING ELEMENT

[75] Inventor: Albert M. A. Rijckaert, Eindhoven, Netherlands

[73] Assignee: U.S. Philips Corporation, New York, N.Y.

[21] Appl. No.: 41,022

[22] Filed: May 21, 1979

[30] Foreign Application Priority Data

May 29, 1978 [NL] Netherlands .......................... 7805804

[51] Int. Cl.³ ............................................. H01L 41/08
[52] U.S. Cl. .................................................. 310/317
[58] Field of Search .......................... 310/314, 316, 317

[56] References Cited

U.S. PATENT DOCUMENTS

| 3,296,467 | 1/1967 | Locher | 310/317 |
| 3,551,764 | 12/1970 | Evans | 310/317 X |
| 3,919,934 | 11/1975 | Beery | 310/317 X |
| 3,968,386 | 7/1976 | Heinzl | 310/316 |
| 4,099,211 | 7/1978 | Hathaway | 360/109 |
| 4,099,876 | 7/1978 | Dorsman | 310/317 X |

Primary Examiner—Mark O. Budd
Attorney, Agent, or Firm—Thomas A. Briody; William J. Streeter; Edward W. Goodman

[57] ABSTRACT

A device for the generation of a control voltage across a piezo-electric positioning element. In order to enable a high voltage to be generated across the piezo-electric element without using a comparatively high supply voltage, use is made of the capacitance of such an element as an integrating element. The device comprises a current source and switches for transferring current pulses to and from the piezo-electric element on command of control pulses.

7 Claims, 22 Drawing Figures

DEVICE FOR THE GENERATION OF A CONTROL VOLTAGE ACROSS A PIEZO-ELECTRIC POSITIONING ELEMENT

BACKGROUND OF THE INVENTION

The invention relates to a device for the generation of a control voltage across a piezo-electric positioning element, in particular for positioning a recording and/or reproducing element relative to an information track.

There are numerous systems employing a piezo-electric positioning element, for example for positioning recording and/or reproducing elements in magnetic or optical recorders, both with record carriers in the form of a tape and a disk, in order to ensure that the element correctly follows the information track (for example in video cassette recorders), or for controlling the position of the element relative to the information track (azimuth control in audio cassette recorders).

Such a system is for example known from German Pat. Application No. 27 11 935 which has been laid open for public inspection, an analog control voltage being applied to a piezo-electric element via a voltage amplifier. Piezo-electric elements are controlled with a comparatively high voltage, so that such a voltage amplifier requires a comparatively high supply voltage, which in the example of the said German Patent Application is a symmetrical supply voltage of +200 V and −200 V. This in itself is a disadvantage because the other components of an apparatus comprising such an amplifier operate with a comparatively low supply voltage, so that this high voltage must be generated separately for said voltage amplifier, which is particularly inconvenient in the case of battery-powered equipment because of the required d.c. transformation and the comparatively high dissipation of such a voltage amplifier.

The applicant's U.S. Patent Application Ser. No. 41,673 (PHN 9136) filed May 23, 1979, describes a system for controlling the position of a read head relative to a record carrier in the form of a tape, which system generates pulse-shaped control signals. When a voltage amplifier is used for applying a control voltage across the piezo electric element, this signal would first have to be converted into an analog voltage, for example by integration,

SUMMARY OF THE INVENTION

It is the object of the invention to provide a device of the type mentioned in the preamble which is adapted to be controlled by pulse-shaped control signals and which does not require a comparatively high supply voltage and whose power consumption is minimal.

To this end, the invention is characterized by a first means for the generation of pulse-shaped control signals, a current source and switching means, coupled to the first means and the current source, for causing an electric current to flow from and to the piezo-electric element under command of the first means.

The invention is based on the recognition that the piezo-electric element behaves capacitively and by itself can operate as an integrating element by transferring current pulses to or from said element under command of said pulse-shaped control signals. The voltage across the piezo-electric element can then become comparatively high relative to the supply voltage required for the device, because the voltage across the piezo-electric element is not applied via a voltage amplifier, which cannot supply a voltage higher than the supply voltage, but by the application of current, so that the voltage across the piezo-electric element is determined by the total amount of current and the capacitance of the piezo-electric element. Due to the presence of the switching means and the integrating action of the piezo-electric, element no current is needed for sustaining voltages, and current flows only during the appearance of control pulses. Consequently, the device consumes minimal power.

In order to obtain a satisfactory voltage isolation between the piezo-electric element and the current source, the device is further characterized in that the device comprises a transformer with a primary and a secondary circuit, that said switching means comprise first and second switching means, that the piezo-electric element in series with the first switching means is included in the secondary circuit of the transformer, and that the current source is included in the primary circuit of the transformer via the second switching means, so that on command of the first means, current pulses can flow in the secondary circuit in both directions and that in the absence of such a command the secondary circuit is interrupted.

In order to obtain a current transfer in two different directions in a simple manner, an embodiment of a device in accordance with the invention is characterized in that the second switching means comprise a first and a second switch and that the transformer has a primary with a center tapping, said center tapping being connected to a first supply terminal, the one end of the primary being connected to said current source via the first switch and the other end of the primary being connected to said current source via the second switch.

This embodiment may further be characterized in that the first switch is constituted by a first transistor of a first conductivity type, the emitter of said first transistor being connected to the current source, the collector to the one end of the primary winding of the transformer, and the base to a first control input, and that the second switch is constituted by a second transistor of said first conductivity type, the emitter of said second transistor being connected to the current source, the collector to the other end of the primary of the transformer, and the base to a second control input.

If bipolar transistors, which are capable of conducting current in one direction only, are used as switches, the embodiment of the device in accordance with the invention may further be characterized in that the first switching means comprise a third transistor of the first conductivity type and a fourth transistor of a second conductivity type, the emitters of said third and fourth transistor being connected to a supply terminal, the collectors to said supply terminal via the secondary circuit, the base of the third transistor to a third control input, and the base of the fourth transistor to a fourth control input.

If the device in accordance with the invention is for example employed in a system for positioning a magnetic head relative to the recorded information track during information read-out using the information track as a reference, this system will not operate if information is to be recorded because then the reference is missing. In such a case, but also for other applications, it is desirable that the piezo-electric positioning element occupies a well-defined position. This cannot be achieved in a satisfactory manner by merely applying a reference voltage, for example zero volts, across the piezo-electric element, because, due to hysteresis effects, the position is also determined by the magnitude and polarity of the voltage across the piezo element and the position of said element just before said voltage was brought to the reference value.

The embodiment of the device in accordance with the invention is found to be particularly suitable for solving this problem. To this end this embodiment is characterized in that the first means comprise outputs which are connected to the first, second, third and fourth control inputs in such a way that the first and the third transistors are turned on and off in phase, that the first means are adapted so that in a first state said outputs have a low output impedance and can supply control signals to the first, second, third and fourth inputs, and in a second state said outputs have a high output impedance so that said outputs follow the potentials on the first, second, third and fourth inputs, the bases of the first and the second transistors respectively being coupled to the collector of the second and the first transistors in a degenerative sense and the bases of the third and the fourth transistors respectively being connected to a first and a second potential point via a first and a second resistor, respectively, in such a way that when the outputs of the first means are in the second state, the third and the fourth transistors are conductive, while there are also provided second means for causing the supply voltage between the center tapping of the primary of the transformer and a point, which is connected to that side of the current source which is remote from the emitters of the first and second transistors, to decrease as a function of time when the outputs of the first means are in the second state.

At the instant that the outputs of the first means become floating, the third and the fourth transistors are turned on and the capacitance of the piezo-element is discharged. Simultaneously the crosswise negative feedback between the collectors and bases of the first and the second transistors is rendered active, so that the two transistors start to function as multivibrators, with the transformer and the capacitance of the piezo-electric element as a resonant circuit. The supply voltage which decreases as a function of time causes the amplitude of this oscillation to decrease in time and the piezoelectric element assumes a well-defined rest position when the oscillation has decayed.

With respect to the means for causing the supply voltage to decrease as a function of time, the device in accordance with the invention may further be characterized in that the second means comprise a buffer capacitor for buffering said supply voltage and a supply switch for disconnecting a power supply source from the buffer capacitor when the outputs of the first means are in the second state.

DESCRIPTION OF THE DRAWINGS

The invention will now be described in more detail with reference to the drawings. In the drawing.

DESCRIPTION OF THE PREFERRED EMBODIMENTS

Figure 1:
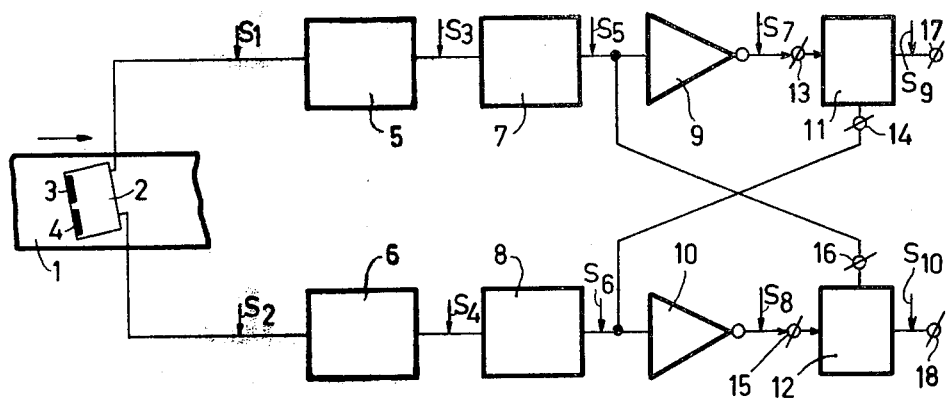
FIG. 1 shows an example of a device for generating pulse-shaped control signals for the device in accordance with the invention.

FIG. 1 shows a device for supplying pulse-shaped signals which are a measure of the phase difference between two signals. This device may be used in conjunction with a preferred embodiment of an amplifier for controlling a piezo-electric element. In this preferred embodiment said device is used for controlling the position of a read head 2 relative to a signal which is recorded on a record carrier 1 in the form of a tape ("azimuth control"). When the gap of a head is not oriented in conformity with the recorded signal, i.e. oriented so relative to the tape that it is not parallel to the gap of the head with which the signal has been recorded, the characteristic of the signal transferred from the write head via the tape to the read head is adversely affected.

Figure 2:
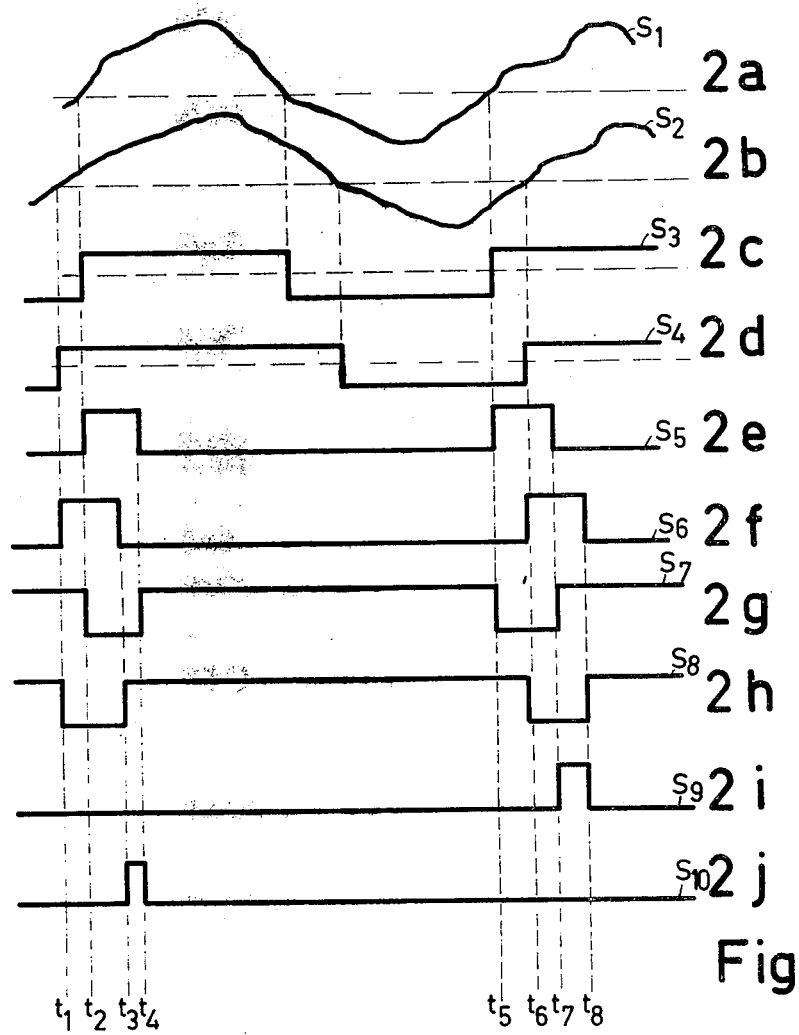
FIG. 2 shows some signal waveforms to illustrate the operation of the device in accordance with FIG. 1.

In order to enable the position of the read head 2 to be controlled relative to the signal recorded on the tape 1, the gap of read head 2 has been divided into two parts 3 and 4, each with a separate coil, not shown, which each supply a signal $S_1$ and $S_2$, respectively. These signals are shown in FIG. 2a and FIG. 2b, respectively, and in the present example exhibit phase differences of different polarity at the instants $t_1$ and $t_2$. The signals $S_1$ and $S_2$ are applied to circuits 5 and 6, respectively, which circuits clean the signals $S_1$ and $S_2$, for example so as to reduce the influence of noise and which each supply an output signal $S_3$ and $S_4$, respectively, which signals are squarewave-shaped and are in synchronism with the zero passages of the signals $S_1$ and $S_2$ respectively. This squarewave-shape may for example be obtained by applying the signals $S_1$ and $S_2$ to a limiting amplifier. These signals $S_3$ and $S_4$ are shown in FIG. 2c and FIG. 2d respectively. The signals $S_3$ and $S_4$ are applied to circuits 7 and 8, respectively, which supply pulses of constant and equal duration in synchronism with the positive zero passages of the signals $S_3$ and $S_4$ respectively, i.e. also in synchronism with the positive zero passages of the signals $S_1$ and $S_2$ respectively. These circuits 7 and 8 may for example be monostable multivibrators, but also counters. FIG. 2e and FIG. 2f respectively represent said signal. Via inverters 9 and 10 the signals $S_5$ and $S_6$ are respectively inverted. These inverted signals $S_7$ and $S_8$ are shown in FIG. 2g and FIG. 2h, respectively. The signals $S_7$ and $S_8$ are respectively applied to inputs 13 and 15 of flops 11 and 12, respectively, while the signals $S_6$ and $S_5$ are respectively applied to inputs 14 and 16 of the flip-flops 11 and 12, respectively. The flip-flops 11 and 12 are of a type in which the signals $S_9$ and $S_{10}$ (see FIG. 2a and FIG. 2j respectively) on output 17 and 18, respectively, are low if the signals $S_6$ and $S_5$ on input 14 and 15 respectively are low and which changes state on the rising edge of the signals $S_7$ and $S_8$ on inputs 13 and 15, respectively, provided that the signals $S_6$ and $S_5$ on inputs 14 and 16 respectively are high. The inverters 9 and 10 may be dispensed with if, for the flip-flops 11 and 12, flip-flops are used which change-over on the negative edges of the signals on inputs 13 and 15. In the example of FIG. 2i, the output signal $S_9$ does not change on the rising edge of the signal $S_7$ at instant $t_4$, because at this instant the signal $S_6$ is low. At instant $t_7$ this signal $S_9$ changes from low to high on the rising edge of the signal $S_7$ at said instant and back from high to low at instant $t_8$ when the signal $S_6$ becomes low again. In this way a pulse with a duration corresponding to the phase difference between the signals $S_1$ and $S_2$ is obtained on output 17, which pulse appears only if the signal $S_1$ leads the signal $S_2$. In a similar way such a pulse is generated on output 18, but only if the signal $S_1$ lags the signal $S_2$. Thus the device of FIG. 1 generates pulses which are a measure of the phase difference between the signals $S_1$ and $S_2$ and thus of an incorrect position of the head 2 relative to the recorded signal. The device of FIG. 1 is described more in general and in more detail in the Applicants' patent application Ser. No. 41,673 (PHN 9136).

Figure 3:
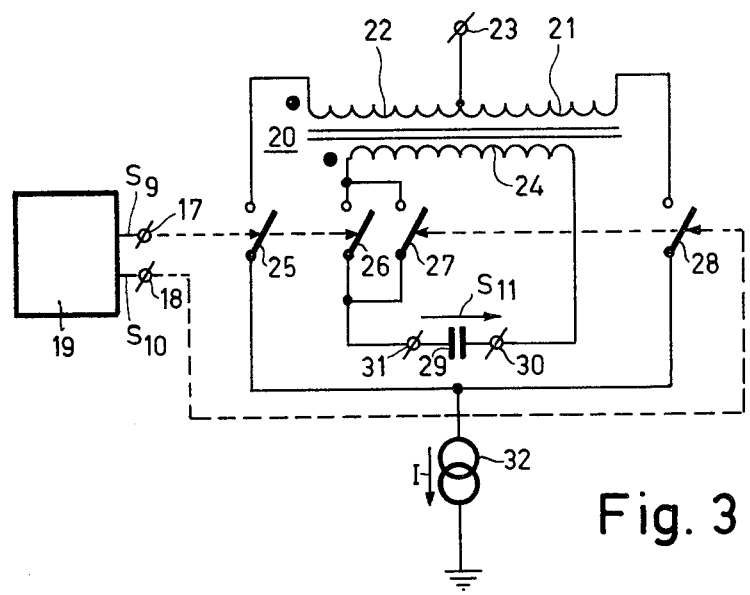
FIG. 3 shows the circuit diagram of a preferred embodiment of a device in accordance with the invention.

FIG. 3 shows a device for the conversion of the output signal of the device of FIG. 1 into a voltage across a capacitive element 29, in which the present embodiment in a piezo-electric element for positioning the head 2.

Figure 4:
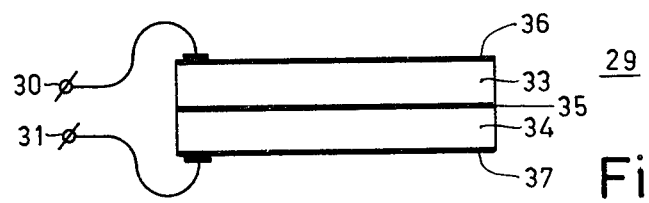
FIG. 4 shows the basic construction of a piezo-electric positioning element.

By way of illustration FIG. 4 shows an example of the construction of such a piezo element. It comprises two layers of a piezo-electric material 33 and 34, which, upon application of an electric field, change in length in opposite directions so as to produce a deflection. These layers 33 and 34 are arranged on a common conductive layer 35 and are provided with electrodes 36 and 37 on the sides facing the layer 35, which electrodes are connected to terminals 30 and 31. From an electrical point of view said piezo-elements behave as a capacitance 29 between terminals 30 and 31.

The device of FIG. 3 comprises a transformer 20 with a primary, consisting of two halves 21 and 22 on which a center tapping leads to a supply terminal 23, and a secondary 24. The piezo electric element 29 in series with two parallel switches 26 and 27 is connected in parallel with the secondary 24, while the primary boxes 21 and 22 and are both connected to a current source 32 via switch 25 and via switch 28. The switches 25 and 26 are activated by the signal $S_9$ on output 17 of a device 19, which may be as shown in FIG. 1, while the switches 27 and are activated by the signal $S_{10}$ on output 18.

To illustrate the operation of the device of FIG. 3, FIG. 5a shows an example of the signal $S_9$, FIG. 5b an example of the signal $S_{10}$, and FIG. 5c the voltage $S_{11}$ produced across the piezo-electric element 29 in response to the signals $S_9$ and $S_{10}$.

Figure 5:
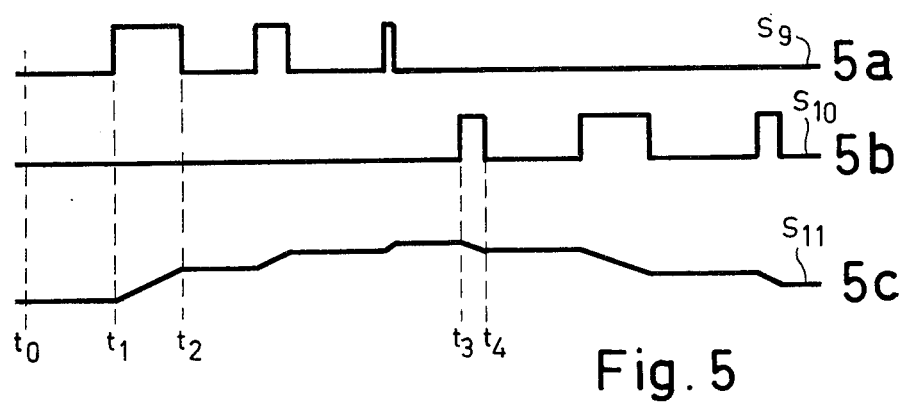
FIG. 5 shows some signal waveforms to illustrate the operation of this device of FIG. 3.

At the instant $t_0$ in FIG. 5 a specific voltage $V_o$ appears across the piezo-electric element 29. If at instant $t_1$ a pulse appears on output 17, switches 25 and 26 are closed and the current I from current source 32 flows throught the primary winding half 22 to supply terminal 23. This current is transformed to the secondary winding 24, and via switch 26, charges the capacitance of the piezo-electric 29. If there flows a secondary current $I_o$, and if the value of capacitance 29 is C and the duration of the pulse is T, the voltage across the piezo-electric element 29 increases with a value $Dv = I_o T/c$; for example $dV = 4V$ for $T - 10^{-6}$ secs, $I_o = 10$ mA and $C = 2.5 \cdot 10^{-9}$ F.

At instant $t_2$ the pulse in the signal $S_9$ has ended and switches $S_{25}$ and $S_{26}$ open, so that charging of the capacitance 29 is discontinued. Upon each further pulse in the signal $S_1$ the voltage $S_{11}$ across capacitance 29 is further increased. If at the instant $t_3$ a pulse appears in the signal $S_{10}$, switches 27 and 28 are closed. The current I then flows via the primary winding half 21 and is transformed to the secondary winding 24 and discharges the capacitance 29 via switch 27 until at instant $t_4$ the pulse in the signal $S_{10}$ ends and switches 27 and 28 open. Further pulses in the signal $S_{10}$ discharge the capacitance 29 further.

The embodiment of FIG. 3 is not the only possibility of supplying the piezo-electric element 29, which behaves as a capacitance, with a comparatively high control voltage by a pulsating current supply and drainage without the need of a source of comparatively high supply voltage. As an example the center tapping of the transformer 20 may be dispensed with if, for example, the current direction in the primary or secondary winding is reversed by commutation depending on whether the pulse appears on output 17 or 18. It is alternatively possible to apply current pulses to a capacitance, with the aid of a choke and switches or rectifying elements, in such a way that the voltage across said capacitance can far exceed the available supply voltage. The use of a current source is not essential either. Thus, it is alternatively possible to use a voltage source in series with a charging resistor. Furthermore, a single switch on the secondary side may be used instead of two switches 26 and 27, provided that both of said switches are controlled both by the signal $S_9$ and by the signal $S_{10}$. It is alternatively possible to employ a transformer with a secondary center tapping, the piezo-electric element being connected to said center tapping and to the one or the other side of the secondary winding via a switch depending on the control signals.

Situations may occur in which the device 19 supplies no signals, for example in the device of FIG. 1 when the head 2 is used as write head and reproduces no signals. In such a case it may be desirable to ensure that the piezo-electric element 29 occupies a rest or reference position, for example by removing the voltage across said element or by applying a reference voltage across said piezo-electric element 29. However, when so arranged, a piezo-element, as the case may be with the inclusion of transport mechanisms, exhibits hysteresis, and the rest position at said reference voltage depends on the last energized condition and is consequently not well-defined. A solution to this problem is to cause the voltage across the piezo-electric element 29 to oscillate symmetrically about the desired reference voltage at a frequency below the resonant frequency of the element and with an amplitude which decreases to zero. This may for example be effected by including the piezo-electric element as capacitance in a resonant circuit which is controlled by a multivibrator, which multivibrator is energized with a voltage which decreases as a function of time.

Figure 6:
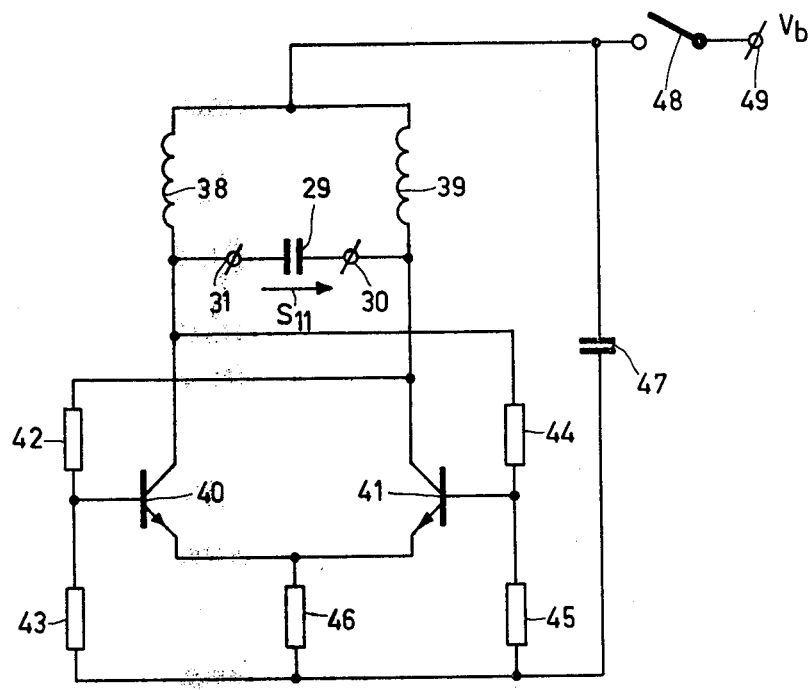
FIG. 6 shows the basic arrangement of a device for bringing a piezo-electric positioning element into a rest position.

FIG. 6 shows the circuit diagram of a multivibrator. It comprises transistors 40 and 41 with a common emitter-resistor 46 and crosswise collector-base negative feed-back via resistors 42, 43 and 44, 45. The piezo-electric element 29 is included between the collector electrodes of the two transistors 40 and, 41 and together with the self-inductance 38 and 39 included in the collector circuits, constitutes a resonant circuit. The collectors of the two transistors 40 and 41 are connected to a supply terminal 49 via the self-inductances 38 and 39 and via a supply switch 48. A power-supply buffer capacitor 47 is connected in parallel with the multivibrator.

Figure 7:
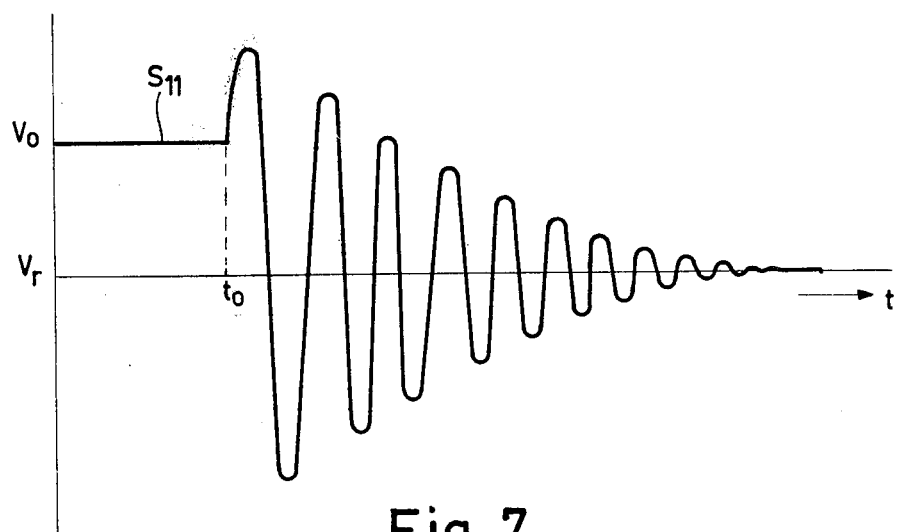
FIG. 7 shows a signal waveform to illustrate the operation of the device of FIG. 6.

FIG. 7 represents the voltage $S_{11}$ across the piezo-electric element 29 as a function of time. Initially a voltage $V_o$ appears across the piezo-electric element 29. The instant $t_O$ the multivibrator is started in a manner not shown in FIG. 6, for example by including the piezo-electric element 29 in the resonant circuit or by activating the crosswise negative-feedback networks. At the same instant the power supply switch 48 is opened. After the instant $t_O$ the piezo-electric element 29 is discharged via the two low-ohmic self-inductances, 38 and 39, so that the average voltage across the piezo-electric element 29 very rapidly decreases from an initial voltage $V_o$ to a reference voltage $V_r$, which in the example of FIG. 6 is 0 volts, so that the oscillation is symmetrical relative to the reference voltage. If the voltage corresponding to the initial voltage $V_o$ is not discharged rapidly enough, a symmetrical oscillation can be obtained by limiting the voltage across the piezo-electric elements 29 symmetrically relative to the reference voltage, for example with zener diodes. The oscillating voltage across the piezo-electric element 29 decreases in amplitude as a function of time, because the multivibrator is energized from the buffer capacitor 47 after switch 48 has been opened. Ultimately the voltage across the piezo-electric element 29 will become equal to $V_r$ and the piezo element 29 will assume a well-defined spatial position corresponding to the voltage $V_r$, hysteresis effects being eliminated by the oscillation. In the absence of the oscillation, the spatial position of the piezo-electric element 29 after discharging of the piezo-electric element 29 to the voltage $V_r$, would depend on the value and polarity of the voltage $V_o$ as a result of hysteresis effects.

The circuit shown in FIG. 6 is not the only possibility of generating an oscillation which decays as a function of time. Instead of a multivibrator, numerous oscillating circuits are possible. Furthermore, the oscillation amplitude can also be made to decrease in a different manner, for example by a variable limiter or output amplifier.

Figure 8:
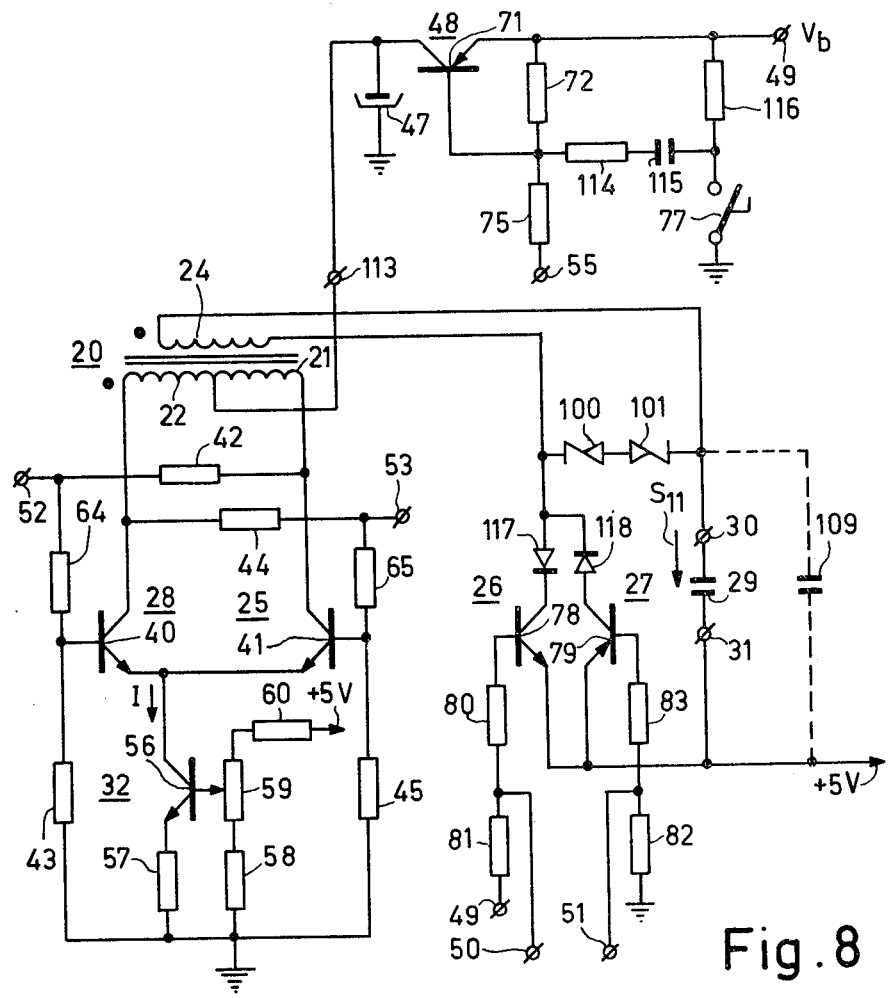
FIG. 8 shows a practical embodiment of a device in accordance with the invention.

FIG. 8 shows a practical example of the basic circuit arrangements in accordance with FIG. 3, which is adapted so as to enable the principle of FIG. 6 to be used. The switches 25 and 28 are realized by means of transistors 41 and 40 respectively, whose collectors respectively lead to the one half 21 and the other half 22 of the primary winding of the transformer 20, the center tapping of said primary winding being connected to the supply terminal 49 which carries a voltage $V_b$. The emitters of transistors 40 and 41 are connected to the current source 32 which comprises a transistor 56 with emitter resistor 57, which transistor 56 receives a base reference voltage from a direct voltage source (+5 V) via a voltage divider comprising the resistors 58, 59 and 60. The bases of transistors 40 and 41 are respectively connected to control inputs 52 and 53 via resistor 64 and 65, respectively, and to the negative supply terminal, in the present example, ground, via resistors 43 and 45, respectively.

If the voltage on input 53 is high and that on input 52 is low, transistor 41 transfers the current I from current source 32 to the half 21 of the primary winding of transformer 20 and if the voltage on input 53 is low and that on input 52 is high, transistor 40 transfers said current I to the primary winding half 22. By applying signals $S_9$ and $S_{10}$, respectively, to control inputs 53 and 52, this part of the circuit of FIG. 8 functions in a similar way as the primary section of the basic arrangement in accordance with FIG. 3.

The secondary winding 24 of transformer 20 is connected to a power supply terminal (+5 V) both via switches 26 and 27 and via the piezo-electric element 29. The switches 26 and 27, respectively, comprise an npn transistor 78 and a pnp transistor 79, which transistors 78 and 79 are connected to the supply point (+5 V) by their emitters. For protection against reverse operation, the collector circuits of transistors 78 and 79 include diodes 117 and 118. The series connection of two zener diodes 100 and 101, with their zener breakdown direction opposed, is included in parallel with the secondary winding for protection against excess voltage. The base electrodes of transistors 78 and 79 are respectively connected to control intput terminals 50 and 51 via resistors 80 and 83, respectively. If the voltages on control inputs 50 and 51 are high, transistor 78 transfers the current which is produced in the secondary winding 24 and if the voltages on control inputs 50 and 51 are low, transistor 79 transfers the current in the opposite direction. If the signal $S_9$ and the inverted signal $S_{10}$ i.e. $\overline{S}_{10}$, are respectively applied to control inputs 50 and 51, the operation of this secondary section is identical to the operation of the secondary section of the circuit of FIG. 3.

Since the quality of the capacitance of piezo-electric elements is sometimes poor, such elements for example often have a comparatively high leakage resistance, it may be desirable, for example in order to increase the RC time constant, to include a capacitor 109 in parallel with the piezo-electric element 29. This may be a permanent connection as shown dashed in FIG. 8, but also a connection via switches so as to enable said capacitor 109 to be included at will.

In order to ensure that the circuit of FIG. 8 operates as described with reference to FIGS. 6 and 7, resistors 42 and 44 are included between inputs 52 and 53, respectively, and the collector of transistor 41 and 40 respectively, and resistors 81 and 82 are included between inputs 50 and 51, respectively, and supply terminal 49 and ground respectively.

When inputs 50, 51, 52 and 53 are energized respectively with the signals $S_9$, $S_{10}$, $S_{10}$ and $S_9$, resistors 42, 44, 81 and 82 do not affect the operation of the circuit. However, when these inputs become floating, transistors 78 and 79 are turned on, so that the capacitance of the piezo-electric element 29 can discharge via the transformer 20, and via resistor 42 and 44, crosswise negative feedback becomes active between the base and collector electrodes of the transistors 40 and 41, so that each transistor operates as a multivibrator with the transformed capacitance of the piezo-electric element 29 and the inductances of the transformer 20 as a resonant circuit. The circuit then behaves in the same way as the circuit of FIG. 6 Zener diodes 100 and 101 then limit the amplitude of the oscillation to values which are symmetrical about 0 V on the secondary side.

In order to ensure that the amplitude of the oscillation decreases as a function of time, as has been described with reference to FIG. 6, a buffer capacitor 47 and a supply switch 48 are included. The switch 48 comprises a pnp transistor 71 whose emitter is connected to the positive supply terminal 49 and to its base via a resistor 72. The base of transistor 71 is furthermore connected to a control input 55 via a resistor 75.

If the voltage on control input 55 is low, transistor 71 is conductive and the primary section of the circuit is energized with the voltage $V_b$ which then also appears across the buffer capacitor 47. When input 55 (simultaneously with the inputs 50, 51, 52 and 53) becomes floating, transistor 71 is turned off and the primary section of the circuit is energized from the buffer capacitor 47, so that the amplitude of the oscillation will decrease as a function of time.

In order to enable the oscillation to be restarted a momentary contact switch 77 is included between the base of transistor 71 and ground. A brief depression of the switch 77 causes transistor 71 to be turned on briefly, so that the buffer capacitor 47 is charged again. In the example of FIG. 8, a switch-shaper is added to the push 77 in order to ensure that transistor 71 is turned on independently of the time that the switch 77 is depressed. For this purpose an RC network with resistor 114 and capacitor 115 is included between the switch 77 and the base of transistor 71, and a resistor 116 between switch 77 and supply terminal 49.

If switch 77 is open and input 55 is floating, the voltage across the capacitor 115 is zero volts. When the switch 77 is closed, the base of transistor 71 goes to zero volts and transistor 71 is turned on. At the same time capacitor 115 is charged via resistor 114, so that after a specific time, which is determined by the time constant of the RC network 114, 115, transistor 71 is turned off.

For the said example of application in cassette recorders, switch 77 may for example be actuated at the same time as the recording switch, so that also if no playback has taken place after the apparatus has been switched on the piezo-electric element 29 is brought into its rest position.

Figure 9:
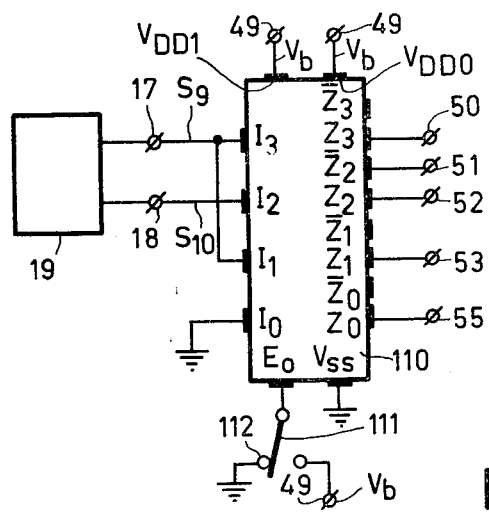
FIG. 9 shows an integrated circuit for transferring control signals to the device of FIG. 8.

FIG. 9 shows an example of the application of signals to the inputs 50, 51, 52, 53 and 55 of the circuit of FIG. 8. Use is made of a logic circuit 110 which transfers signals on the inputs to low-ohmic outputs with the possibility of rendering said outputs floating (=high-ohmic). An example of such a circuit 110 is an integrated circuit which is available from N. V. Philips' Gloeilampenfabrieken under type no. HEF 4104B. The input and output designations of IC 110 in FIG. 9 correspond to the description of this IC HEF 4104B in "Philips data handbook, Semiconductors and integrated circuits", Part Oct. 6, 1977.

The operation of the IC 110 is as follows. If the voltage on input $E_O$ is high, the signals on the outputs $Z_0$, $Z_1$, $Z_2$ and $Z_3$ correspond to the signals on inputs $I_0$, $I_1$, $I_2$ and $I_3$, the outputs $\overline{Z}_0$, $\overline{Z}_1$, $\overline{Z}_2$ and $\overline{Z}_3$ being the inverse of the signals on inputs $I_0$, $I_1$, $I_2$ and $I_3$. If the voltage on input $E_0$ is low, the outputs $Z_0$, $Z_1$, $Z_2$, $Z_3$, $\overline{Z}_0$, $\overline{Z}_1$, $\overline{Z}_2$ and $\overline{Z}_3$ are floating.

In order to ensure that the circuit of FIG. 8 operates as described, the control inputs 50, 51, 52, 53 and 55 are respectively connected to the outputs $Z_3$, $\overline{Z}_2$, $Z_2$, $Z_1$ and $Z_0$. The signal $S_{10}$ is applied to input $I_2$ and the signal $S_9$ to inputs $I_1$ and $I_3$. Input $I_0$ is connected to ground (="low") and input $E_0$ to a switch 111 which either makes a connection to ground or to the positive supply voltage $V_b$.

If input $E_0$ is connected to supply voltage $V_b$, the signals on control inputs 50, 51, 52 and 53 corresponds to signals $S_9$, $\overline{S}_{10}$, $S_{10}$ and $S_9$ respectively. Control input 55 is then low, so that the circuit of FIG. 8 operates as described previously with actuated power supply switch 48.

When switch 111 is changed over so that input $E_0$ is connected to ground, the power supply switch 48 is opened and the circuit will oscillate with decreasing amplitude.

The circuit arrangement in accordance with FIGS. 8 and 9 is realised with the following components:

| | |
|---|---|
| 110 | HEF 4104B |
| 40, 41, 56 | BD 335 |
| 78, 103 | BF 422 |
| 79, 104 | BF 423 |
| 71 | BD 262 |
| 100, 101 | BZX 61C120 |
| 117, 118 | BY 206 |
| 47 | 150 microfarads |
| 109 | 0.15 microfarads |
| 115 | 4.7 microfarads |
| 43, 45 | 6800 ohms |
| 64, 65, 80, 83 | 4700 ohms |
| 42, 44, 81, 82, 105, 108, 114, 116 | 10,000 ohms |
| 57 | 4.7 ohms |
| 58 | 1000 ohms |
| 60 | 2200 ohms |
| 72, 106, 107 | 47,000 ohms |
| 75 | 22,000 ohms |
| 59 | potentiometer 2200 ohms |
| transformer 20 | primary 2 × 180 turns secondary 5400 turns |
| $V_b$ | 10–15 V. |

What is claimed is:

1. A device for the generation of a control voltage across a piezo-electric positioning element comprising means for generating pulse-shaped control signals; a first and a second switching means, each of said switching means having control input means for receiving said control signals; a current source; and a transformer having a primary and a secondary winding, said transformer primary winding being coupled by said second switching means to said current source and said transformer secondary winding being coupled in a serial loop with said first switching means and said piezo-electric positioning element; whereby when said generating means generates control signals, said second switching means are selectively actuated such that a first current from said current source is allowed to flow in said transformer primary winding, the direction of said first current flow being determined by said control signals, and said first switching means are selectively actuated such that a second current, induced in said transformer secondary winding, is allowed to proportionately charge or discharge said piezo-electric positioning element, depending upon the direction of said second current flow which in turn is dependent on the direction of said first current flow, and when said generating means ceases to generate control signals, said first and said second switching means are deactuated thereby stopping the flow of said second and said first currents, respectively.

2. A device as claimed in claim 1, wherein the second switching means comprise a first and a second switch each having a control input and the transformer primary winding is provided with a center tapping, said center tapping being connected to a first supply terminal, and wherein one end of the transformer primary winding is connected to said current source via the first switch and the other end of the transformer primary winding is connected to said current source via the second switch, the control input for each of said switches being coupled to said generating means.

3. A device as claimed in claim 2, characterized in that the first switch is constituted by a first transistor of a first conductivity type, the emitter of said first transistor being connected to the current source, the collector to the one end of the primary winding of the transformer, and the base being connected to a first control input, and that the second switch is constituted by a second transistor of said first conductivity type, the emitter of said second transistor being connected to the current source, the collector to the other end of the primary winding of the transformer, and the base being connected to a second control input, said first and second control inputs being said control inputs of said first and second switches respectively.

4. A device as claimed in claim 3, characterized in that the first switching means comprise a third transistor of the first conductivity type, and a fourth transistor of a second conductivity type, the emitters of said third and fourth transistor being connected to a supply terminal, the collectors being connected to said supply terminal via the transformer secondary winding and said piezo-electric positioning element, the base of the third transistor being connected to a third control input, and the base of the fourth transistor being connected to a fourth control input, said third and fourth control inputs being said control input means of said first switching means.

5. A device as claimed in claim 4, characterized in that the generating means comprise control outputs which are respectively connected to the first, second, third and fourth control inputs, said generating means being arranged such that the control signals supplied on said control outputs turn said first and third transistors on and off in phase, and turn said second and fourth transistors on and off in phase, and that the generating means are adapted so that in a first state said control outputs have a low output impedance and can supply said control signals to the first, second, third and fourth control inputs, and that in a second state said control outputs have a high output impedance so that the control outputs follow the potential on the first, second, third and fourth control inputs, the bases of the first and the second transistors being respectively coupled to the collectors of the second and the first transistors in a degenerative sense, and the bases of the third and the fourth transistors being respectively connected to a first and a second potential via a first and a second resistor respectively, in such a way that when the outputs of the first means are in the second state the third and fourth transistors are conductive.

6. A device as claimed in claim 5, characterized in that it further comprises means for causing the supply voltage between the center tapping of the transformer primary winding and a point which is connected to that side of the current source which is remote from the emitters of said first and said second transistors, to decrease as a function of time when the control outputs of said generating means are in the second state.

7. A device as claimed in claim 6, characterized in that the supply voltage decreasing means comprises a buffer capacitor for buffering said supply voltage and a supply switch for disconnecting a power supply source from the buffer pacitor when the control outputs of the generating means are in the second state.

* * * * *